United States Patent
Sun et al.

(10) Patent No.: US 8,036,622 B2
(45) Date of Patent: Oct. 11, 2011

(54) DC OFFSET CANCELLATION CIRCUIT FOR A RECEIVER

(75) Inventors: Runhua (Ray) Sun, Tustin, CA (US); Christian Holenstein, San Diego, CA (US); James Jaffee, Solana Beach, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 1336 days.

(21) Appl. No.: 11/341,184

(22) Filed: Jan. 28, 2006

(65) Prior Publication Data
US 2007/0072571 A1 Mar. 29, 2007

Related U.S. Application Data

(60) Provisional application No. 60/722,063, filed on Sep. 28, 2005.

(51) Int. Cl.
*H04B 1/10* (2006.01)
*H04B 17/00* (2006.01)

(52) U.S. Cl. ............. 455/296; 455/67.11; 455/310; 455/312; 455/226.1

(58) Field of Classification Search .... 455/67.11–67.14, 455/226.1, 296, 310, 312
See application file for complete search history.

(56) References Cited

U.S. PATENT DOCUMENTS

| | | | | |
|---|---|---|---|---|
| 3,764,983 A | * | 10/1973 | Stok | 340/870.04 |
| 4,958,139 A | * | 9/1990 | Hyatt | 341/139 |
| 5,724,653 A | * | 3/1998 | Baker et al. | 455/296 |
| 5,812,025 A | * | 9/1998 | Shimazaki | 330/129 |
| 5,898,912 A | * | 4/1999 | Heck et al. | 455/234.2 |
| 6,009,317 A | * | 12/1999 | Wynn | 455/296 |
| 6,075,409 A | * | 6/2000 | Khlat | 329/304 |
| 6,122,487 A | * | 9/2000 | Yamashita | 455/78 |
| 6,144,243 A | * | 11/2000 | Vaisanen | 327/307 |
| 6,240,100 B1 | * | 5/2001 | Riordan et al. | 370/442 |
| 6,498,929 B1 | | 12/2002 | Tsurumi | |
| 6,748,200 B1 | | 6/2004 | Webster | |
| 6,907,235 B2 | * | 6/2005 | Lisenbee | 455/296 |
| 7,020,220 B2 | * | 3/2006 | Hansen | 375/324 |
| 7,110,734 B2 | * | 9/2006 | Mohindra | 455/234.1 |

(Continued)

FOREIGN PATENT DOCUMENTS

EP 0719013 A2 6/1996

(Continued)

OTHER PUBLICATIONS

International Search Report and Written Opinion—PCT/US2006/038534, International Search Authority—European Patent Office—Jun. 12, 2006.

*Primary Examiner* — Duc M Nguyen
(74) *Attorney, Agent, or Firm* — Howard H. Seo; Ramin Mobarhan

(57) ABSTRACT

Techniques for cancelling DC offset are described. A DC offset cancellation circuit in a receiver cancels DC offsets caused by leaked LO (local oscillator) signals from a LO signal generator. The receiver first calibrates itself by using the DC offset cancellation circuit during a transmit mode. During the calibration, the DC offset cancellation circuit stores the DC offset voltage signal caused by the leaked LO signals. During a receiving mode when the receiver is receiving a signal, the receiver subtracts the stored DC offset voltage signal from the received signal to cancel the DC offsets caused by leaked LO signals.

32 Claims, 3 Drawing Sheets

U.S. PATENT DOCUMENTS

| | | | |
|---|---|---|---|
| 7,254,379 B2* | 8/2007 | Xu et al. | 455/296 |
| 7,305,037 B2* | 12/2007 | Josefsson et al. | 375/257 |
| 7,512,171 B2* | 3/2009 | Barnes et al. | 375/130 |
| 2002/0032039 A1* | 3/2002 | Kimata | 455/556 |
| 2002/0042256 A1 | 4/2002 | Baldwin | |
| 2002/0097081 A1* | 7/2002 | Razavi et al. | 327/307 |
| 2002/0197975 A1 | 12/2002 | Chen | |
| 2003/0064697 A1 | 4/2003 | Twomey | |
| 2003/0156668 A1* | 8/2003 | Atkinson et al. | 375/345 |
| 2003/0223480 A1* | 12/2003 | Cafarella | 375/219 |
| 2004/0082302 A1 | 4/2004 | Shippee | |
| 2004/0106380 A1* | 6/2004 | Vassiliou et al. | 455/73 |
| 2005/0141634 A1* | 6/2005 | Lin | 375/295 |
| 2006/0094386 A1* | 5/2006 | Darabi et al. | 455/296 |

FOREIGN PATENT DOCUMENTS

| | | |
|---|---|---|
| EP | 0964557 A1 | 12/1999 |
| JP | 10093647 | 4/1998 |
| JP | 10308684 | 11/1998 |
| WO | WO98/43357 | 10/1998 |
| WO | WO2004038939 | 5/2004 |

* cited by examiner

DC OFFSET CANCELLATION CIRCUIT FOR A RECEIVER

The present Application for Patent claims priority to Provisional Application No. 60/722,063 entitled "DC OFFSET CANCELLATION CIRCUIT FOR A RECEIVER" filed Sep. 28, 2005, and assigned to the assignee hereof and hereby expressly incorporated by reference herein.

BACKGROUND

1. Field

The present disclosure relates generally to electronics, and more specifically to a DC offset cancellation circuit in a receiver.

2. Background

In a digital communication system, a transmitter processes traffic data to generate data chips and further modulates a local oscillator (LO) signal with the data chips to generate a radio frequency (RF) modulated signal. The transmitter then transmits the RF modulated signal via a communication channel. The communication channel degrades the RF modulated signal with noise and possibly interference from other transmitters.

A receiver receives the transmitted RF modulated signal, downconverts the received RF signal from RF to baseband, digitizes the baseband signal to generate samples, and digitally processes the samples to recover the traffic data sent by the transmitter. The receiver uses one or more downconversion mixers to frequency downconvert the received RF signal from RF to baseband. An ideal mixer simply translates an input signal from one frequency to another frequency without distorting the input signal. An ideal mixer receives an input RF signal in one input port and an LO signal from an LO generator in another input port and downconverts the input RF signal to a baseband signal by using the LO signal.

However, in an actual real world downconversion mixer, the LO signal from an LO signal generator may leak into the input port for the input RF signal. The LO signal leaks into the input port for the input RF signal through capacitive and substrate coupling (e.g., parasitic capacitance) that may exist between the input port for the input RF signal and the input port for the LO signal. Furthermore, the LO signal also may leak into an input port of a low noise amplifier (LNA) that may precede the downconversion mixer. The leakage LO signal produces a DC component in the output signal of the downconversion mixer. Basically, the DC component creates a DC offset in the output signal of the downconversion mixer, and the DC offset may eventually saturate an analog-to-digital converter (ADC) that digitizes the output signal of the downconversion mixer. Thus, the ADC will output incorrect values when the ADC is saturated by the DC offset.

Therefore, there is a need in the art for a circuit that minimizes the DC offset produced by leakage LO signals.

SUMMARY

A DC offset cancellation circuit for a receiver is described herein. In an embodiment, a DC offset cancellation circuit in a receiver cancels DC offset caused by leakage LO signals from a LO signal generator. The receiver first calibrates itself by using the DC offset cancellation circuit during a transmit mode when the receiver is not receiving any signal. The receiver calibrates itself by first grounding the input of an LNA so that the LNA does not receive any inputs except for the leakage LO signals from the LO signal generator. A downconversion mixer receives the output of the LNA that is generated based on the leaked LO signals from the LO signal generator. In addition, the input of the mixer may also receive leakage LO signals directly from the LO signal generator.

The downconversion mixer downconverts the received signal to a baseband signal. The baseband signal is a product of the leakage LO signals. An adder receives the baseband signal and subtracts a correction signal from the baseband signal. The resulting offset signal is filtered by a filter and converted to an offset voltage signal. A controller in the receiver closes a switch coupled to the filter and a capacitor to form a feedback loop and allow the offset voltage signal to be stored on the capacitor. A transconductance cell receives the offset voltage signal and generates the correction signal. The switch remains closed until the offset voltage signal reaches a settled value. The controller opens the switch after the offset voltage signal has reached a settled value. An analog-to-digital converter (ADC) digitizes the settled offset voltage signal, and the digitized value is stored in a residual register.

During a receive mode when the receiver receives a signal and processes the received signal, the transconductance cell generates the correction signal based on the offset voltage signal stored on the capacitor. The adder subtracts the correction signal from the received signal to cancel any leaked LO signal(s) that causes DC offset. The ADC digitizes the resulting signal, and another adder subtracts the digitized offset voltage signal stored in the residual register from the digitized resulting signal to cancel any remaining leaked LO signal(s).

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The DC offset cancellation circuit described herein may be used for a direct-conversion receiver (such as Zero Intermediate Frequency receiver) and possibly other types of receivers. The direct-conversion receiver frequency downconverts the received RF signal from RF directly to baseband in one stage. Other types of receivers perform frequency downconversion in multiple stages. The different types of receivers may use different circuit blocks and/or have different circuit requirements. For clarity, the DC offset cancellation circuit is described below for the direct-conversion receiver.

Figure 1:
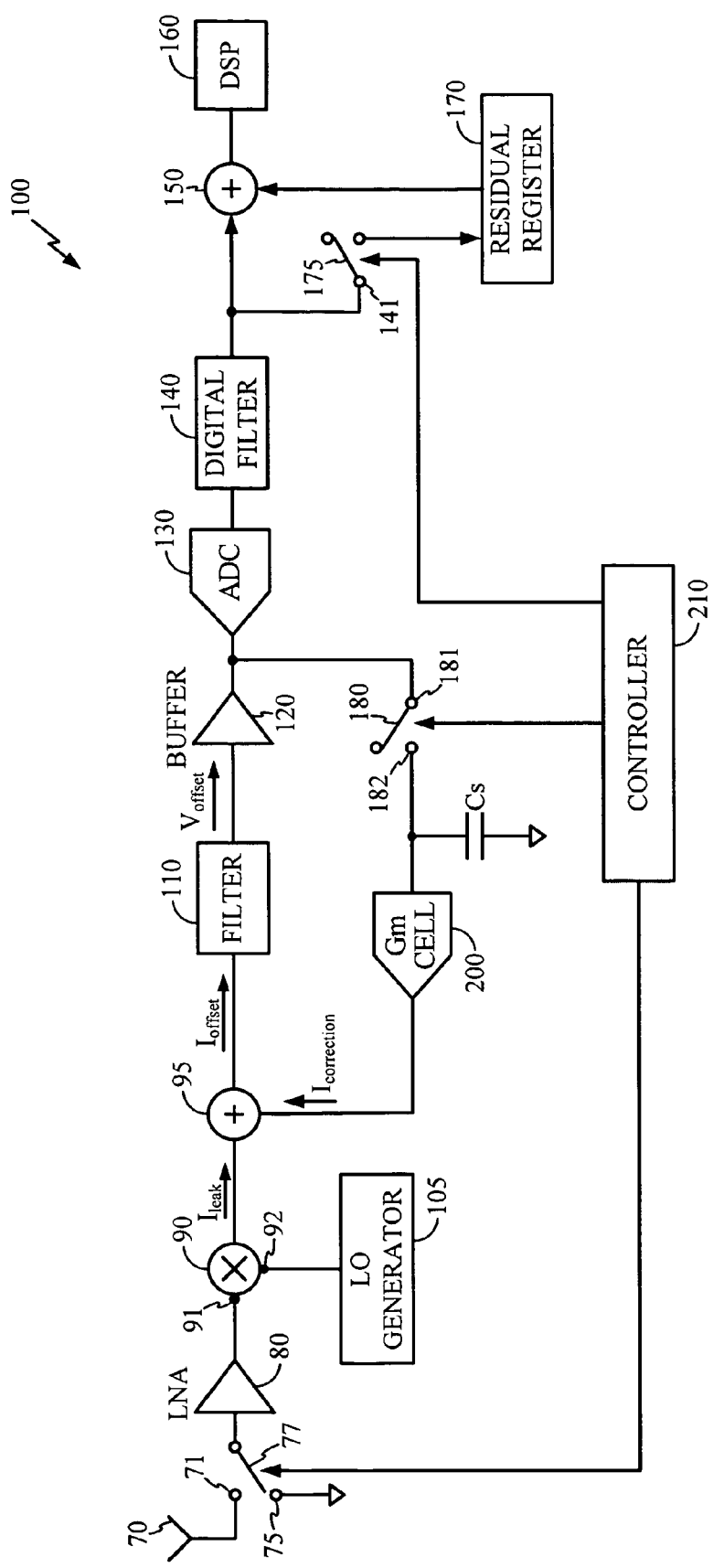
FIG. 1 shows a receiver with a DC offset cancellation circuit.

FIG. 1 shows a block diagram of a RF receiver 100 that includes a DC offset cancellation circuit. Within receiver 100, a low noise amplifier (LNA) 80 amplifies a received RF signal with a fixed or variable gain and provides an amplified RF signal that includes both I and Q signals. The I and Q signals are 90° out of phase but have the same frequency. A downconversion mixer 90 receives the I signal from LNA 80 at an input port 91 and receives LO signal from an LO generator 105 at an input port 92. The Q signal from LNA 80 is processed by another parallel circuit that processes the Q signal in a same manner as the I signal, as described below. For the sake of brevity, the description is directed just to the processing of the I signal; however, the description given below also applies to the processing of the Q signal. Downconversion mixer 90 outputs a baseband signal that has been downconverted from the received RF signal. The frequency of the LO signal is selected such that the signal component in an RF channel of interest is downconverted to baseband or near baseband. However, the LO signal may leak into input port 91 or into the input of LNA 80 through capacitive and substrate coupling (e.g., parasitic capacitance) and cause DC offset, as explained above. Receiver 100 cancels the DC offset caused by LO signal leakage as described below.

During a transmit mode (Tx) when receiver 100 is not receiving any signal, receiver 100 performs the following operation to calibrate itself so that DC offset caused by LO signal leakage may be cancelled. First, a controller 210 sends a command to a switch 77 to connect the input of LNA 80 to a node 75 that is connected to an AC ground so that LNA 80 will not receive any inputs from an antenna 70. Therefore, the input of LNA 80 is disconnected from a node 71. Controller 210 may be a processor, a CPU, a DSP processor, a hardware state machine or a micro controller.

Figure 2:
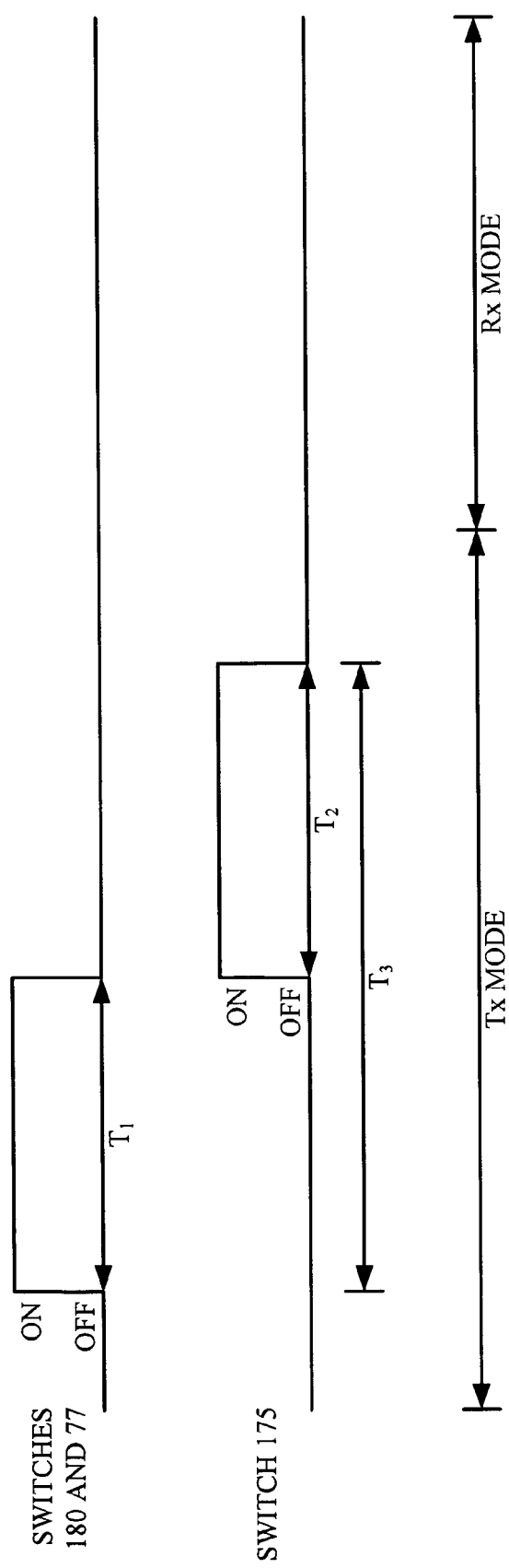
FIG. 2 shows an operational timing diagram for various switches in the receiver.

As shown on FIG. 2, switch 77 turns on and connects the input of LNA 80 to node 75 during time T1. Time T1 occurs during the transmit mode. Since the input of LNA 80 is connected to the AC ground, LNA 80 should not produce any outputs. However, the LO signal may leak into the input of LNA 80 and produce an output from LNA 80. The LO signal leaking into the input of LNA 80 will be amplified by LNA 80. The output signal caused by the leaked LO signal will enter into input port 91 of downconversion mixer 90. Furthermore, the LO signal from LO generator 105 may also leak into input port 91 directly, so input port 91 may receive the amplified LO signal from LNA 80 and the LO signal from LO generator 105. Downconversion mixer 90 outputs a current signal, $I_{leak}$, caused by the leaked LO signals. $I_{leak}$ signal is basically a baseband signal (i.e., DC offset signal) that was down converted from the leaked LO signals.

When receiver 100 is operating in the receive mode (Rx), downconversion mixer 90 produces a current signal that is a combination of $I_{leak}$ and the received signal. If the effect of $I_{leak}$ is not canceled or minimized, $I_{leak}$ may eventually saturate an analog to digital converter (ADC) 130. However, receiver 100 cancels the DC offset caused by $I_{leak}$ as explained further below.

Referring back to the calibration performed by receiver 100 during the transmit mode when receiver 100 is not receiving any signal, an adder 95 receives $I_{leak}$ and $I_{correction}$ current signal from a Gm cell 200 and outputs a current signal $I_{offset}$ that is equal to ($I_{leak}-I_{correction}$). Initially, $I_{correction}$ may be approximately equal to zero, so $I_{offset}$ may equal $I_{leak}$ in the beginning. However, the value of $I_{correction}$ will eventually increase to cancel the effect of $I_{offset}$.

A lowpass filter 110 receives $I_{offset}$ and outputs a voltage signal $V_{offset}$. $V_{offset}$ is a voltage signal representing the current signal, $I_{offset}$. Generally, lowpass filter 110 filters the baseband signals from downconversion mixer 90 to pass the signal components in the RF channel of interest and to remove noise and undesired signal components, such as jammer signal. Lowpass filter 110 has an output impedance designated as Rfilter.

A buffer 120 receives the voltage signal Voffset and outputs a same voltage signal Voffset. Buffer 120 is a unity gain buffer that is used to drive the input of an ADC 130. The output of buffer 120 is coupled to a node 181 of a switch 180. As shown in FIG. 2, controller 210 sends a command to switch 180 to close switch 180 (i.e., connect node 181 to a node 182) during time period T1 when receiver 100 is in the transmit mode (Tx) and is calibrating itself to cancel DC offset created by the leaked LO signals. Receiver 100 calibrates itself during a time period T3 that is equal to T1+T2. Controller 210 also send a command during the time period T1 to switch 77 to connect the input of LNA 80 to node 75, as explained above.

Referring back to FIG. 1, when switch 180 closes, a capacitor Cs starts to charge up to a voltage equal to $V_{offset}$. Gm cell 200 receives the voltage signal $V_{offset}$ and outputs current signal $I_{correction}$ that is equal to $Gm^*V_{offset}$. Gm cell 200 is a transconductance amplifier that produces a current signal based on a received voltage signal. Gm cell 200 has a transconductance equal to Gm. Adder 95 receives the current signal $I_{correction}$ from Gm cell 200 and subtracts $I_{correction}$ from $I_{leak}$.

Thus, when switch 180 is closed, lowpass filter 110, buffer 120, Gm cell 200 and adder 95 form a closed feedback loop and the value of $V_{offset}$ is determined by the following equations:

$$[I_{leak}-I_{correction}]*Rfilter=V_{offset};$$

$$[I_{leak}-V_{offset}*Gm]*Rfilter=V_{offset}; \text{ then}$$

$$V_{offset}=(I_{leak}*Rfilter)/(1+Gm*Rfilter)$$

Thus, the DC offset cancellation circuit in receiver 100 includes switches 180, 175 and 77, Gm cell 200, adder 95 and capacitor Cs. Without the DC offset cancellation circuit in receiver 100, $V_{offset}$ would be equal to $I_{leak}*Rfilter$. However, as shown by the above equation, $V_{offset}$ is reduced by a factor of $(1+Gm*Rfilter)$. Thus, the closed feedback loop formed by switch 180, lowpass filter 110, buffer 120, Gm cell 200 and adder 95 performs a coarse DC offset cancellation.

The value of $V_{offset}$ eventually settles to a settled value, and capacitor Cs is charged to the settled value. The length of time period T1 is predetermined based on the operating parameters of lowpass filter 110, buffer 120 and Gm cell 200 such that the length of time period T1 is long enough for $V_{offset}$ to settle down to a certain value.

At the end of time period T1 when $V_{offset}$ has reached a settled value, controller 210 send a command to switch 180 to open switch 180 so that node 181 is disconnected from node 182. Capacitor Cs retains the settled value of $V_{offset}$ after switch 180 has opened. An analog-to-digital converter (ADC) 130 receives the settled value of $V_{offset}$ and converts $V_{offset}$ to a digital value. Although any type of ADC may be used to implement ADC 130, receiver 100 is ideally suited for operation with high dynamic range noise-shaped ADCs, such as a Delta-Sigma ADC, or other noise-shaped ADCs. A digital filter 140 receives the digitized value of $V_{offset}$, attenuates quantization noise present in the received signal and perform jammer filtering.

After controller 210 opens switch 180, controller 210 sends a command to switch 175 to connect node 141 to an input of a residual register 170. When switch 175 is closed, residual register 170 receives the digital value of the settled $V_{offset}$ and stores the digital value of $V_{offset}$. The stored digital value of $V_{offset}$ will be used to cancel any residual value of $V_{offset}$ that was not canceled by the coarse cancellation performed by switch 180, Gm cell 200, capacitor Cs and adder 95. In other words, residual register 170 and an adder 150 will perform fine cancellation of the DC offset caused by $V_{offset}$, as explained in more detail below Controller 210 sends a command to switch 175 to disconnect node 141 from the input of residual register 170 after the digital value of $V_{offset}$ has been stored in residual register 170. After this step, the calibration operation is finished.

As shown in FIG. 2, when the transmit mode is finished, receiver 100 enters into a receiving mode (Rx) where receiver 100 receives and processes signals. Receiver 100 now uses the voltage stored on capacitor Cs (the settled value of $V_{offset}$) and the digital value of $V_{offset}$ stored in residual register 170 to cancel the DC offset caused by leakage current from LO generator 105 when receiver 100 is operating in the receiving mode.

During the receiving mode, receiver 100 performs the following operation to cancel the DC offset caused by the leaked LO signal from LO generator 105. During the receiving mode, switches 180, 175 and 77 are turned off (i.e., they are disconnected). Antenna 70 receives a signal, and LNA 80 receives and amplifies the received signal. The LO signal from LO generator 105 may leak into the input of LNA 80, as explained above. If the LO signal leaks into the input of LNA 80, then LNA 80 outputs an amplified signal that is a combination of the received signal and the leaked LO signal.

Downconversion mixer 90 receives the amplified signal from LNA 80 which may include the amplified leaked LO signal and downconverts the received signal to a baseband signal. In addition, the LO signal also may leak into input 91 of downconversion mixer 90 and combine with the amplified signal from LNA 80. Thus, the baseband signal outputted by mixer 90 includes $I_{leak}$ signal that was caused by the leaked LO signals. Adder 95 receives the baseband signal from mixer 90 and $I_{correction}$ signal from Gm cell 200. Adder 95 subtracts $I_{correction}$ signal from the baseband signal. Gm cell 200 generates $I_{correction}$ signal based on the settled $V_{offset}$ value stored in capacitor Cs. $V_{offset}$ was stored in capacitor Cs during the calibration that occurred during the previous transmit mode, as explained above. Therefore, $I_{correction}$ signal performs a coarse cancellation of the $I_{leak}$ signal generated by the leaked LO signal, as explained above.

Lowpass filter 110 receives the baseband signal from adder 95 and filters the baseband signal from downconversion mixer 90 to pass the signal components in the RF channel of interest and to remove noise and undesired signal components, such as jammer signal. Lowpass filter 110 outputs a voltage signal. Buffer 120 receives the filtered basedband signal and drives ADC 130 with the received baseband signal. Since most of the $I_{leak}$ signal was canceled by $I_{correction}$ signal, the baseband signal does not saturate ADC 130. ADC 130 receives the baseband signal and outputs a corresponding digital signal.

Digital filter 140 receives the digital signal, attenuate quantization noise present in the received digital signal and perform jammer filtering. Adder 150 receives the filtered digital signal and the residual Voffset value stored in residual register 170. Adder 150 subtracts the residual Voffset value from the filtered digital signal to perform fine cancellation of the Ileak signal caused by the leaked LO signals. In other words, adder 150 cancels any part of Ileak signal that was not canceled by Icorection signal by subtracting the residual Voffset signal from the received digital signal. Adder 150 outputs a digital signal that has subtracted residual Voffset to DSP processor 160 for further processing. The above process performed by receiver 100 cancels DC offset caused by Ileak signal.

In the next transmit mode, receiver 100 performs another calibration and stores another Voffset value in capacitor Cs and residual register 170 to cancel Ileak signal caused by leaked LO signals.

Figure 3:
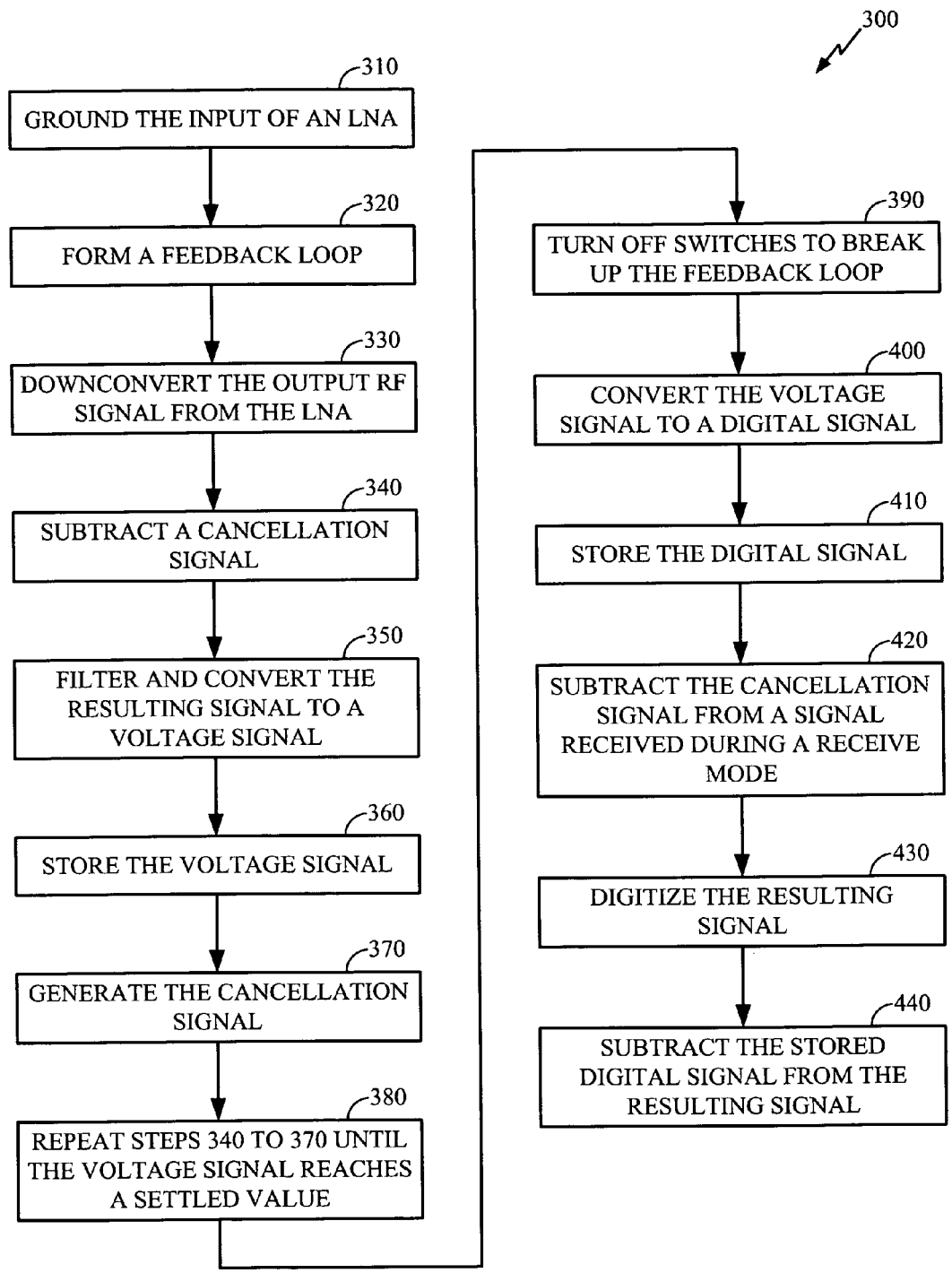
FIG. 3 shows a flow chart process for canceling DC offset.

FIG. 3 illustrates a flow chart outlining the DC offset cancellation method 300 in accordance with an embodiment of the present invention.

In step 310, when a receiver with a DC offset cancellation circuit enters into a transmit mode, the input of a low noise amplifier is AC grounded by turning on a first switch. In step 320, a feedback loop circuit is formed by closing a second switch at the same time as the first switch. In step 330, the output RF signal from the low noise amplifier is downconverted into a baseband signal, $I_{leak}$, which results from leaked LO signals. In step 340, a cancellation signal, $I_{correction}$, generated by a transconductance amplifier is subtracted from $I_{leak}$. In step 350, the resulting signal ($I_{leak}$–$I_{correction}$) is filtered and converted to a voltage signal, $V_{offset}$. In step 360, $V_{offset}$ is stored in a capacitor by charging the capacitor. In step 370, the transconductance amplifier generates the $I_{correction}$ signal based on the $V_{offset}$ signal. In step 380, the steps 340 to 370 are repeated until $V_{offset}$ reaches a settled value. In step 390, the first and second switches are turned off to break up the feedback loop. In step 400, the settled $V_{offset}$ signal is converted into a digital signal. In step 410, the digital $V_{offset}$ signal is stored in a residual register. In step 420, when the receiver enters into a receive mode and receives a signal, the $I_{correction}$ signal generated by the transconductance amplifier is subtracted from the received signal to cancel the DC offset caused by leaked LO signals. In step 430, the resulting signal is digitized. In step 440, the digital $V_{offset}$ signal stored in the register is subtracted from the digitized received signal to cancel any residual DC offset.

The DC offset cancellation circuit described herein may be used for various communication systems. For example, the DC offset cancellation circuit may be used for Code Division Multiple Access (CDMA) systems, Time Division Multiple Access (TDMA) systems, Frequency Division Multiple Access (FDMA) systems, Orthogonal Frequency Division Multiple Access (OFDMA) systems, multiple-input multiple-output (MIMO) systems, wireless local area networks (LANs), and so on. A CDMA system may implement a radio access technology (RAT) such as Wideband CDMA (W-CDMA), cdma20000, and so on. RAT refers to the technology used for over-the-air communication. A TDMA system may implement a RAT such as Global System for Mobile Communications (GSM). Universal Mobile Telecommunication System (UMTS) is a system that uses W-CDMA and GSM as RATs. The DC offset cancellation circuit may also be used for various frequency bands such as, for example, a cellular band from 824 to 894 MHz, a Personal Communication System (PCS) band from 1850 to 1990 MHz, a Digital Cellular System (DCS) band from 1710 to 1880 MHz, an International Mobile Telecommunications-2000 (IMT-2000) band from 1920 to 2170 MHz, and so on.

The DC offset cancellation circuit described herein may be implemented within an integrated circuit (IC), an RF integrated circuit (RFIC), an application specific integrated circuit (ASIC), a printed circuit board (PCB), an electronic device, and so on. The DC offset cancellation circuit may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), and so on.

It is to be understood that even though various embodiments and advantages of the present invention have been set forth in the foregoing description, the above disclosure is illustrative only, and changes may be made in detail, yet remain within the broad principles of the invention. Therefore, the present invention is to be limited only by the appended claims.

What is claimed is:

1. A circuit comprising:
a transconductance amplifier for generating a correction signal based on an offset voltage;
a first adder for receiving an input signal and the correction signal, the first adder generating an output signal by subtracting the correction signal from the input signal to remove a first portion of a DC offset in an analog domain;
a filter for receiving the output signal and generating the offset voltage during a first operation mode;
a capacitor for storing the offset voltage in the analog domain; and
a register for storing a settled value of the offset voltage in the digital domain, the offset voltage also to remove a further portion of the DC offset in a digital domain.

2. The circuit of claim 1, further comprising a first switch for coupling the filter to the capacitor to store the offset voltage during the first operation mode.

3. The circuit of claim 2, further comprising a controller for sending a command to the first switch to couple the filter to the capacitor.

4. The circuit of claim 3, further comprising an analog to digital converter (ADC) for receiving the offset voltage and generating a digitized offset voltage.

5. The circuit of claim 4, further comprising
a register for storing the digitized offset voltage; and
a second switch for coupling the ADC to the register to store the digitized offset voltage.

6. The circuit of claim 5, wherein the controller sends a command to the second switch to couple the ADC to the register after sending a decouple command to the first switch to decoupled the filter from the capacitor.

7. The circuit of claim 6, further comprising a second adder coupled to the register for receiving a digitized input and generating a digitized output by subtracting the digitized offset voltage from the digitized input.

8. The circuit of claim 6, wherein the controller sends a decouple command to the second switch to decouples the ADC from the register after the register has stored the digitized offset voltage.

9. The circuit of claim 8, a mixer operative to frequency downconvert an input radio frequency (RF) signal with a local oscillator (LO) signal and generate an output baseband signal, wherein the output baseband signal is the input signal to the first adder.

10. The circuit of claim 9, further comprising a low noise amplifier for amplifying a received RF signal to generate the input RF signal to the mixer.

11. The circuit of claim 10, wherein the LO signal leaked to an input of the mixer or an input of the low noise amplifier creates the offset voltage.

12. The circuit of claim 6, wherein the controller sends the decouple command to the first switch after the offset voltage has reached a settled value.

13. The circuit of claim 12, wherein the capacitor stores the settled value of the offset voltage before the end of the first operation mode.

14. The circuit of claim 13, wherein the first adder subtracts the correction signal based on the settled value from the input signal during a second operation mode.

15. A method comprising:
(a) downconverting an RF signal to a baseband signal;
(b) subtracting a correction signal from the baseband signal to remove a first portion of a DC offset in an analog domain and to produce an offset signal;
(c) generating the correction signal based on the offset signal during the calibration mode, the offset signal also to remove a further portion of the DC offset in a digital domain; and
storing the offset voltage in the analog domain and a settled value of the offset voltage in the digital domain.

16. The method of claim 15, further comprising:
repeating steps (a) to (c) until the offset signal reaches a settled value during the calibration mode.

17. The method of claim 16, further comprising:
storing the settled value of the offset signal during the calibration mode.

18. The method of claim 17, further comprising:
grounding an input of an amplifier to generate the RF signal during the calibration mode.

19. The method of claim 18, wherein the RF signal is caused by a leaked local oscillator signal.

20. The method of claim 17, further comprising during the calibration mode:
digitizing the settled value of the offset signal to generate a digitized offset signal;
storing the digitized offset signal in a register.

21. The method of claim 20, further comprising:
downconverting a received RF signal to a received baseband signal during a receive mode.

22. The method of claim 21, further comprising during the receive mode:
generating the correction signal based on the stored settled value of the offset signal; and
subtracting the correction signal generated from the stored settled value from the received baseband signal to produce a corrected baseband signal.

23. The method of claim 22, further comprising:
digitizing the corrected baseband signal to produce a digitized corrected signal during the calibration mode; and
subtracting the stored digitized offset signal from the digitized corrected signal during the receive mode.

24. An apparatus comprising:
means for downconverting an RF signal to a baseband signal;
means for subtracting a correction signal from the baseband signal to remove a first portion of a DC offset in an analog domain and to produce an offset signal;
means for generating the correction signal based on the offset signal during a calibration mode, the offset signal also to remove a further portion of the DC offset in a digital domain; and
means for storing the offset voltage in the analog domain and a settled value of the offset voltage in the digital domain.

25. The apparatus of claim 24, wherein the offset signal reaches a settled value.

26. The apparatus of claim 25, further comprising:
means for storing the settled value of the offset signal.

27. The apparatus of claim 26, further comprising:
means for grounding an input of an amplifier to generate the RF signal.

28. The apparatus of claim 27, wherein the RF signal is caused by a leaked local oscillator signal.

29. The apparatus of claim 28, further comprising:
means for digitizing the settled value of the offset signal to generate a digitized offset signal; and
means for storing the digitized offset signal.

30. The apparatus of claim 29, further comprising:
means for subtracting the stored digitized offset signal from a received digitized baseband signal.

31. The apparatus of claim 26, wherein the stored settled value of the offset signal is subtracted from the baseband signal.

32. A non-transitory processor readable media for storing instructions operable in a receiver to:
couple an input of an amplifier in the receiver to a ground during a calibration mode;
couple a filter to a capacitor to form a feedback loop to generate a correction signal; and
decouple the filter from the capacitor after the correction signal has reached a settled value.

\* \* \* \* \*